(12) United States Patent
Lee et al.

(10) Patent No.: US 9,609,099 B2
(45) Date of Patent: Mar. 28, 2017

(54) MOBILE TERMINAL

(71) Applicant: LG ELECTRONICS INC., Seoul (KR)

(72) Inventors: Kyunghwan Lee, Seoul (KR); Jaehyuk Kang, Seoul (KR); Guetae Cho, Seoul (KR)

(73) Assignee: LG Electronics Inc., Seoul (KR)

( * ) Notice: Subject to any disclaimer, the term of this patent is extended or adjusted under 35 U.S.C. 154(b) by 53 days.

(21) Appl. No.: 14/669,779

(22) Filed: Mar. 26, 2015

(65) Prior Publication Data

US 2016/0033996 A1 Feb. 4, 2016

(30) Foreign Application Priority Data

Aug. 4, 2014 (KR) .................... 10-2014-0099707

(51) Int. Cl.
*F16B 5/02* (2006.01)
*H04M 1/02* (2006.01)
(Continued)

(52) U.S. Cl.
CPC ............. *H04M 1/0277* (2013.01); *F16B 5/02* (2013.01); *G06F 1/1626* (2013.01);
(Continued)

(58) Field of Classification Search
CPC .. H04M 1/0249; H04M 1/0277; H04M 1/026; F16B 37/062; F16B 37/125;
(Continued)

(56) References Cited

U.S. PATENT DOCUMENTS

2010/0048147 A1* 2/2010 Kim .................... H04M 1/0249
455/90.3
2011/0027036 A1 2/2011 Park et al.

FOREIGN PATENT DOCUMENTS

KR 10-2010-0023188 A 3/2010
KR 10-2011-0024002 A 3/2011
(Continued)

*Primary Examiner* — Adrian S Wilson
*Assistant Examiner* — Abhishek Rathod
(74) *Attorney, Agent, or Firm* — Dentons US LLP

(57) ABSTRACT

A mobile terminal includes a display unit, a front case configured to be combined with the display unit using a front side of the front case, a main board configured to be combined with a rear side of the front case, a rear case configured to be combined with a rear side of the main board, a boss in which a internal screw thread formed on both a left side and a right side of the front case and the internal screw thread heading a rear side is formed, a connection hole formed on a position corresponding to the internal screw thread of the rear case, a screw configured to be connected with the internal screw thread in a manner of passing through the connection hole, a boss bump configured to be positioned at an outer circumstance of the boss and a boss accommodation part configured to be formed on both a left side and a right side of the main board and correspond to a shape of the boss and a shape of the boss bump. It is able to reduce thickness of the mobile terminal by omitting a frame. And, it is able to prevent the case from making a gap in a horizontal direction via a stable connection structure. Moreover, it is also able to prevent the front case and the rear case from being separated from each other via the stable connection structure.

8 Claims, 12 Drawing Sheets

(51) Int. Cl.
*G06F 1/16* (2006.01)
*F16B 37/06* (2006.01)
*F16B 37/12* (2006.01)
*H05K 5/00* (2006.01)

(52) U.S. Cl.
CPC ........ *G06F 1/1658* (2013.01); *H04M 1/0249* (2013.01); *F16B 37/062* (2013.01); *F16B 37/125* (2013.01); *G06F 1/1601* (2013.01); *H05K 5/0008* (2013.01)

(58) Field of Classification Search
CPC ........ F16B 39/284; F16B 5/02; G06F 1/1601; G06F 1/1626; G06F 1/1658; H05K 5/0008
See application file for complete search history.

(56) References Cited

FOREIGN PATENT DOCUMENTS

| | | |
|---|---|---|
| KR | 10-2012-0115019 A | 10/2012 |
| KR | 10-2014-0036625 A | 3/2014 |

\* cited by examiner

MOBILE TERMINAL

This application claims the benefit of the Korean Patent Application No. 10-2014-0099707, filed on Aug. 4, 2014, which is hereby incorporated by reference as if fully set forth herein.

BACKGROUND OF THE INVENTION

Field of the Invention

The present invention relates to a frameless terminal from which a frame supporting a rear side of a display unit is omitted.

Discussion of the Related Art

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

As functions of a terminal are diversifying, the terminal is implemented as a form of a multimedia player equipped with such complex functions as capturing a picture or a video, playing music or a video file, gaming, broadcast reception and the like.

Thickness of a mobile terminal is gradually getting thinner in order to secure portability of the mobile terminal. A supporting structure tends to be minimized to make the mobile terminal thinner. Yet, when the supporting structure is minimized, hardness of the mobile terminal becomes weak and the mobile terminal becomes vulnerable to an external impact. Hence, ongoing effort to develop a stable connection structure of a mobile terminal while minimizing the supporting structure is in progress.

SUMMARY OF THE INVENTION

In a frameless mobile terminal in which a frame is omitted, an object of the present invention is to provide a mobile terminal configured to supplement a vulnerable structure due to the omission of the frame and the mobile terminal in which a connection force of a case is reinforced.

To achieve these objects and other advantages and in accordance with the purpose of the invention, as embodied and broadly described herein, a mobile terminal includes a display unit, a front case configured to be combined with the display unit using a front side of the front case, a main board configured to be combined with a rear side of the front case, a rear case configured to be combined with a rear side of the main board, a boss in which a internal screw thread heading a rear side is formed on both a left side and a right side of the front case, a connection hole formed on a position corresponding to the internal screw thread of the rear case, a screw configured to be connected with the internal screw thread in a manner of passing through the connection hole, a boss bump configured to be positioned at an outer circumstance of the boss and a boss accommodation part configured to be formed on both a left side and a right side of the main board and correspond to a shape of the boss and a shape of the boss bump.

The boss bump is projected from a side of the boss. The boss accommodation part includes a boss groove recessed in both the left side and the right side of the main board in response to the shape of the boss and a bump groove recessed in the boss groove in response to the shape of the boss bump.

The boss bump can be diagonally projected on the basis of a horizontal direction of the boss or can be projected in up/down direction.

The boss bump can be formed as many as at least two or more for each boss.

The boss bump may be lower than the boss in height.

The boss bump is projected toward the rear case in a manner of being separated from the boss and the boss accommodation part can include a boss groove at which the boss is positioned and a bump hole through which the boss bump is passing.

A height of the boss is more projected to a rear side direction compared to the main board and a height of the boss bump may be lower than a height of the boss.

The boss bump may include a curved line or may be formed by a shape of a polygon.

The mobile terminal can further include a connection hook configured to be formed between a plurality of bosses of the front case and a connection groove configured to be formed on the rear case and configured to be combined with the connection hook.

An opening is configured to be formed at the center of the front case and the main board is configured to support a rear side of the display unit via the opening.

According to at least one or more embodiments of the present invention, it is able to reduce thickness of a mobile terminal by omitting a frame. And, it is able to prevent a case from making a gap in a horizontal direction via a stable connection structure. Moreover, it is also able to prevent a front case and a rear case from being separated from each other via the stable connection structure.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein.

DETAILED DESCRIPTION OF THE INVENTION

Figure 1A:
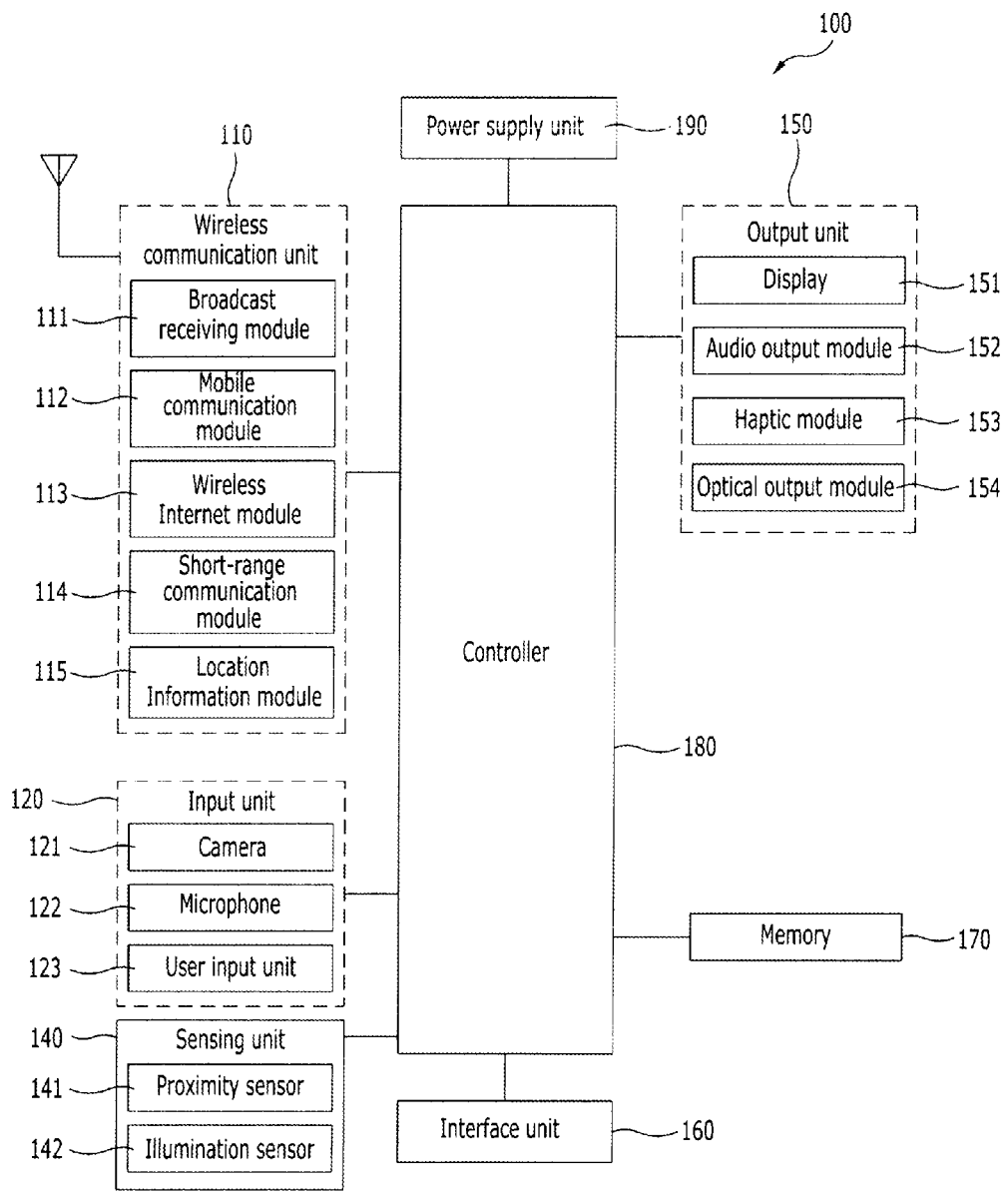
FIG. 1A is a block diagram of a mobile terminal in accordance with the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
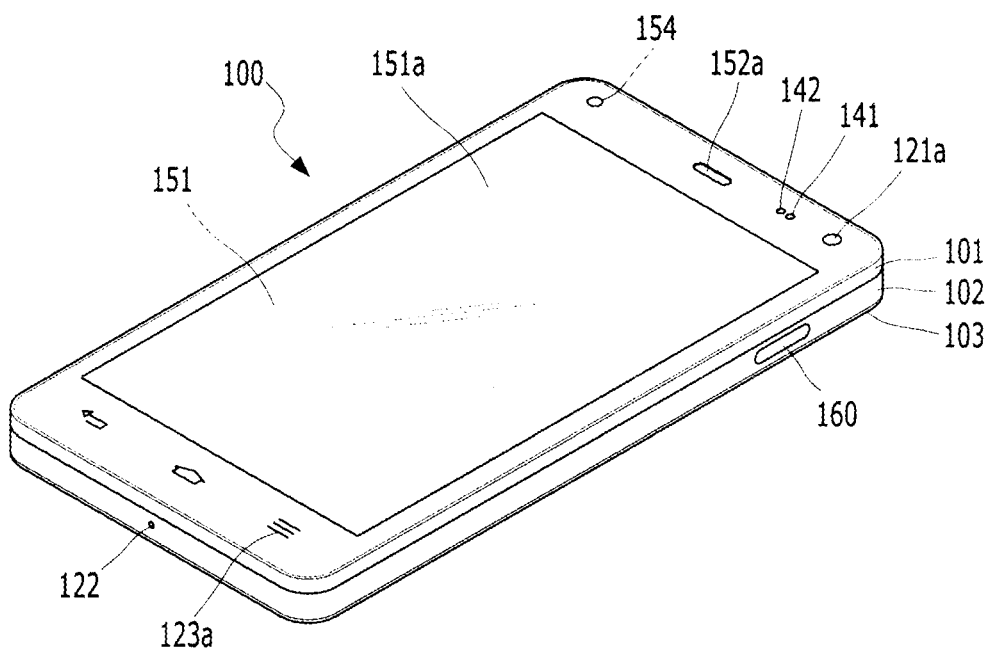
FIGS. 1B and 1C are conceptual views of one example of the mobile terminal, viewed from different directions.
Figure 1C:
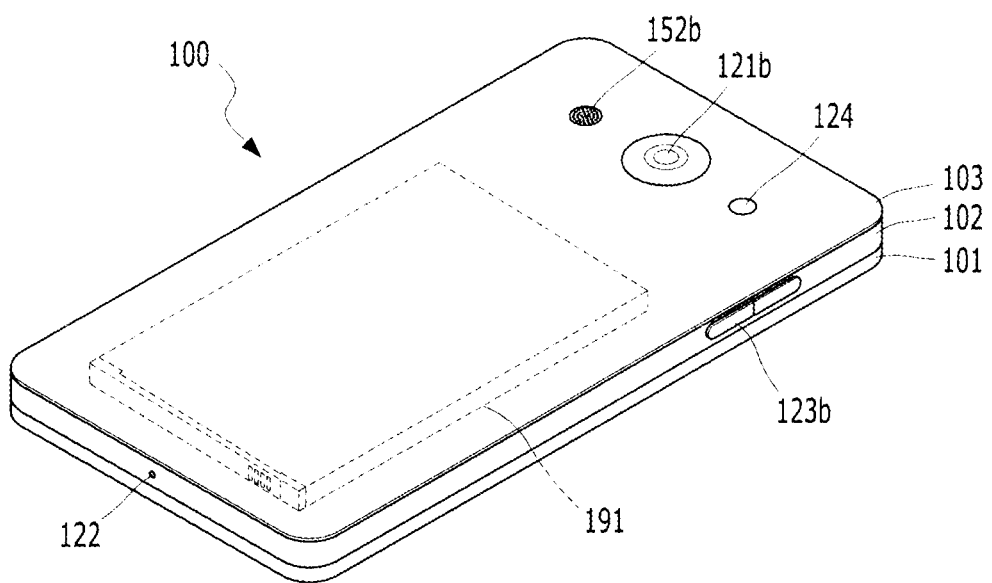

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

Referring now to FIG. 1A, the mobile terminal 100 is shown having wireless communication unit 110 configured with several commonly implemented components. For instance, the wireless communication unit 110 typically includes one or more components which permit wireless communication between the mobile terminal 100 and a wireless communication system or network within which the mobile terminal is located.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142.

If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs.

The controller 180 may provide or process information or functions appropriate for a user by processing signals, data, information and the like, which are input or output by the various components depicted in FIG. 1A, or activating application programs stored in the memory 170. As one example, the controller 180 controls some or all of the components illustrated in FIGS. 1A-1C according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151*a* of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121*b* or an audio output module 152*b*.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151*a* and the front case 101, between the front case 101 and the rear case 102, or between the rear case 102 and the rear cover 103, to hermetically seal an inner space when those cases are coupled.

FIGS. 1B and 1C depict certain components as arranged on the mobile terminal.

However, it is to be understood that alternative arrangements are possible and within the teachings of the instant disclosure. Some components may be omitted or rearranged. For example, the first manipulation unit 123*a* may be located on another surface of the terminal body, and the second audio output module 152*b* may be located on the side surface of the terminal body.

The display unit 151 outputs information processed in the mobile terminal 100. The display unit 151 may be implemented using one or more suitable display devices.

Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

As shown in FIG. 1C, a flash 124 is shown adjacent to the second camera 121b. When an image of a subject is captured with the camera 121b, the flash 124 may illuminate the subject.

As shown in FIG. 1B, the second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

Figure 2:
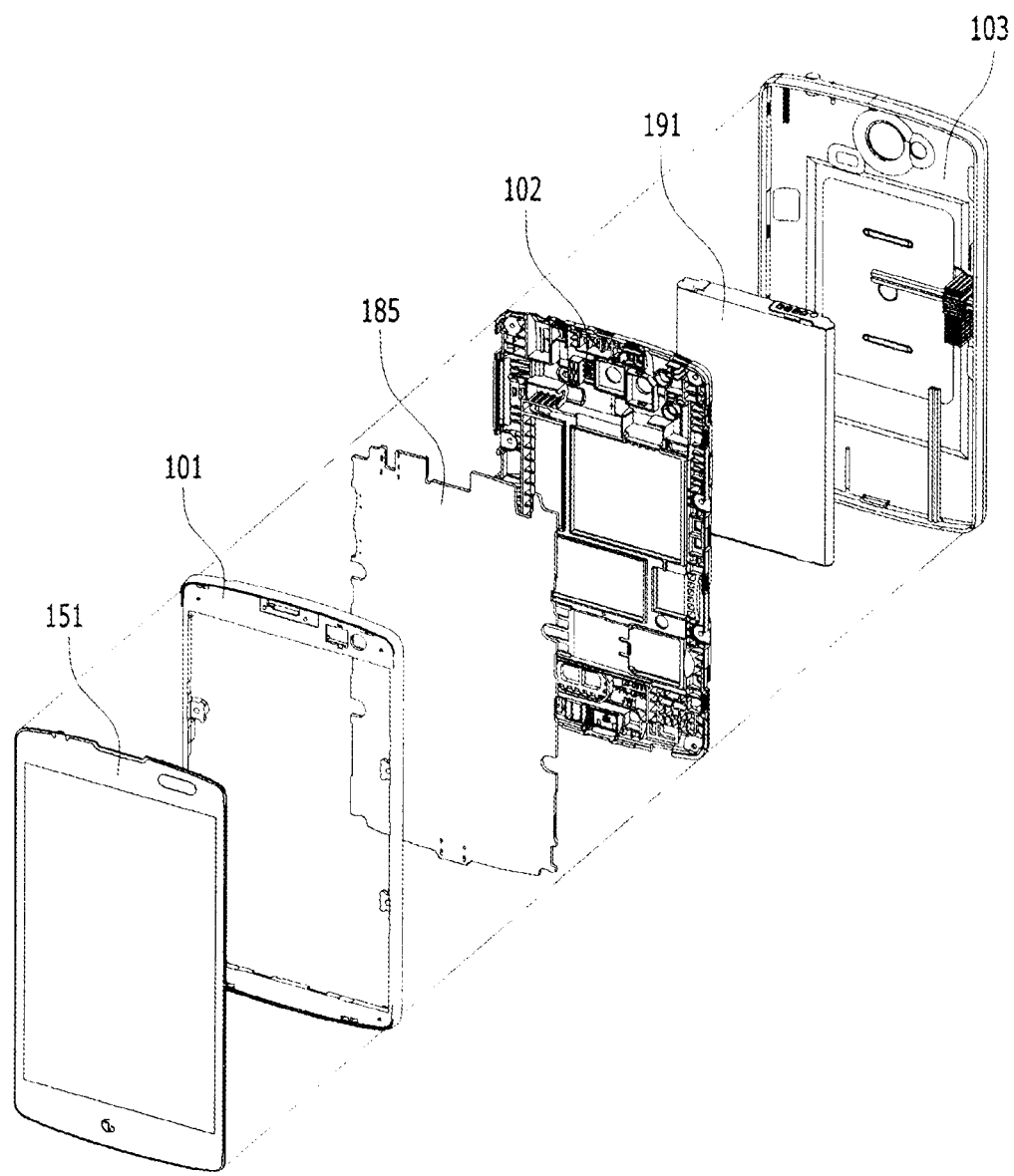
FIG. 2 is a disassembled perspective diagram for an example of a mobile terminal according to present invention.
Figure 3:
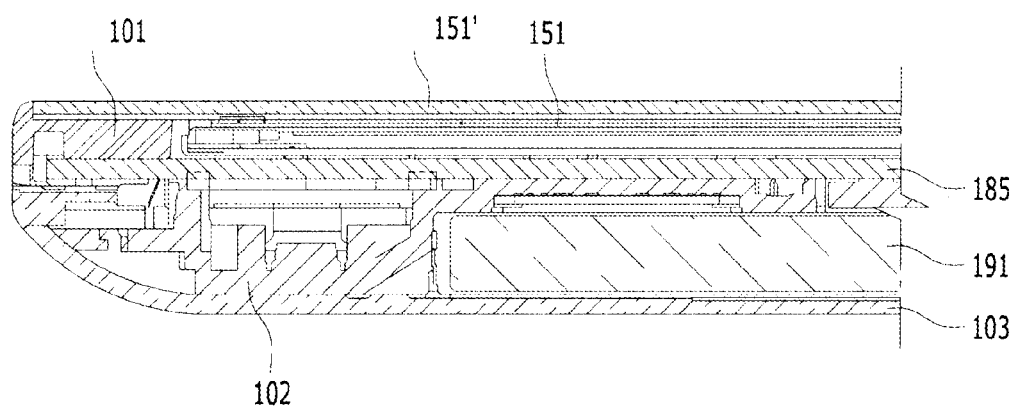
FIG. 3 is a cross sectional diagram for an example of a mobile terminal according to the present invention.

FIG. 2 is a disassembled perspective diagram for an example of a mobile terminal according to present invention and FIG. 3 is a cross sectional diagram for an example of a mobile terminal 100 according to the present invention the mobile terminal 100 according to the present invention can include a display unit 151, a front case 101, a main board 185 a rear case 102, a battery and a rear cover.

The display unit 151 forms a front side of the mobile terminal 100 and is combined with a front side of the front case 101. Since the display unit 151 is smaller than the front case 101 and a window positioned at the front of the display unit 151 is larger than the display unit 151, the window covers all of the front side of the front case 101. In order not to expose a circumstance part of the display unit 151 to external except a part on which image information of the display unit is outputted, bezel can be printed on a rear side circumstance of the window 151'.

The front case 101 of the present invention forms a front side of the mobile terminal 100. Recently, a part to which the front case 101 is exposed to the front is covered by the window 151' and the front case 101 can be exposed to outskirts of a side part.

An opening is formed on a center of the front case 101 and forms a part in which the display unit 151 is safely puts. In particular, the front case 101 supports a side of the display unit 151 and a camera, a proximity sensor and the like are mounted on a circumstance part of the display unit 151.

A legacy mobile terminal 100 used to be further equipped with a frame including a metallic material, which is positioned at a rear side of the display unit 151, to support the rear side of the display unit 151 and reinforce the mobile terminal 100. Although the frame supports hardness of the mobile terminal 100, the frame increases thickness, weight and manufacturing cost of the mobile terminal 100. Hence, according to the present invention, the frame is omitted. Instead of the frame, a main board 185 supports a rear side of the display unit 151.

The main board 185 corresponds to a part on which various electronic parts are mounted. Overall control of the mobile terminal 100 is controlled by the main board. In a legacy mobile terminal 100 equipped with a frame, the main board 185 covers a part of the mobile terminal 100 and various electronic parts are mounted on both sides of the main board 185. Yet, according to the present invention, since a front side of the main board 185 is in contact with a rear side of the display unit 151 and supports the display unit 151, an electronic part is not mounted on a front side of a part corresponding to the display unit 151.

A rear case 102 covers a rear side of the main board 185. The rear side 102 is combined with the front case 101 positioned at the front and forms an exterior of the mobile terminal 100. The rear case 102 and the front case 101 are combined with each other via a circumstance part. An electronic apparatus unit on which parts including the main board 185 and the like are mounted is provided between the rear case and the front case.

Figure 4:
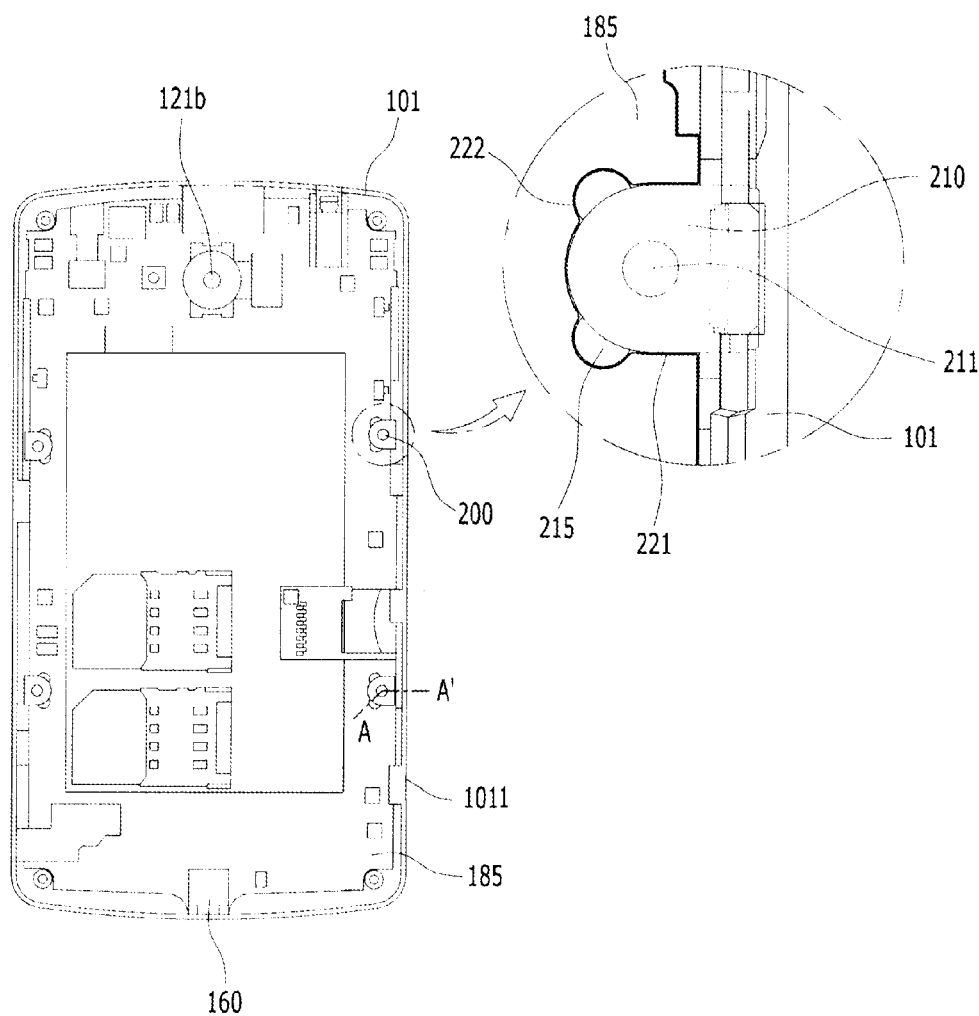
FIG. 4 is a rear side diagram for an example of a mobile terminal according to the present invention.
Figure 5:
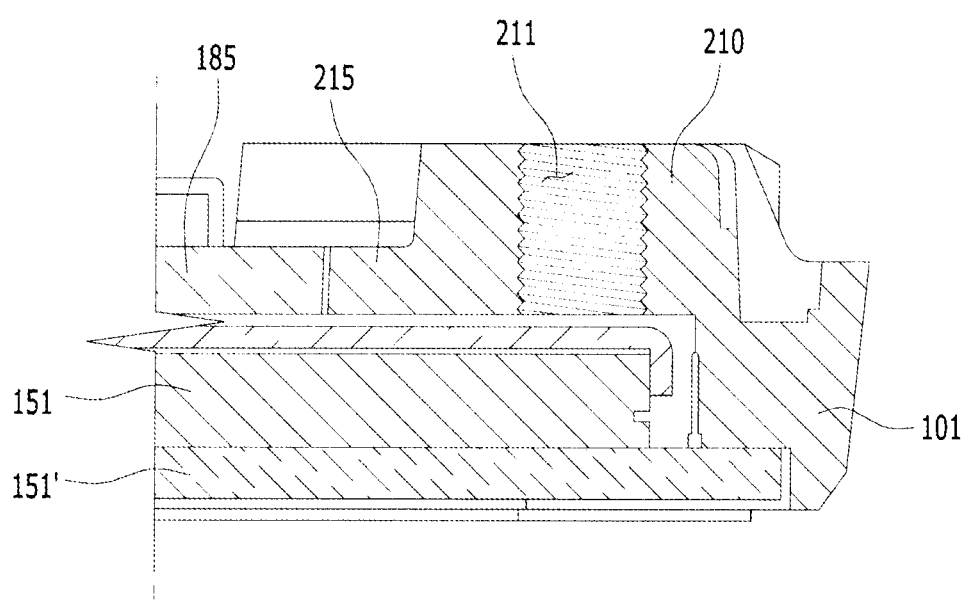
FIG. 5 is a A-A' cross sectional diagram of FIG. 4.

FIG. 4 is a rear side diagram for an example of a mobile terminal 100 according to the present invention and FIG. 5 is a cross sectional diagram of FIG. 4. Referring to FIG. 4 and FIG. 5, it shows a state that a front case 101 is combined with a main board 185. It shows a rear side of a mobile terminal in a state that a rear case 102 and a rear cover are eliminated.

A boss 210 in which a internal screw thread 211 is formed is arranged to a circumstance of the front case 101 to insert a screw into the boss. A plurality of the boss 210 are arranged to the circumstance of the front case 101 in a manner of being separated from each other. The screw is inserted into the internal screw thread 211 in a manner of passing through a connection hole formed on the rear case 102.

A side of a case of the mobile terminal 100 can be constructed with the front case 101 only or the rear case 102 only. A part of the side adjacent to a front side is constructed with the front case 101 and a part of the side adjacent to a rear side can be constructed with the rear case 102.

For clarity, the present embodiment is explained on the basis of an embodiment forming a side of the mobile terminal 100 by a sidewall projected to a rear side direction from a front side circumstance of the front case 101 and a sidewall projected to a front side direction from a rear side circumstance of the rear case 102.

A boss 210 is projected to an inside direction from a sidewall of the front case 101. If a sidewall is thick, a size of an electronic apparatus unit becomes reduced. Hence, the boss 210 with which a screw is connected can be formed in a manner of being projected to an inside direction only. The boss 210 can be formed in a place higher than the main board 185 in a rear side direction. In particular, the boss 210 can be formed in a manner of being extended to the rear side direction to make the boss to be in contact with an internal side of the rear case 102.

Since the boss 210 is formed in a manner of being projected to the inside compared to a sidewall, a boss groove 221 internally recessed in response to a shape of the boss 210 is formed on a position where the boss 210 is formed on the mainboard 185.

According to the present invention, a boss bump 215 projected on a side circumstance of the boss 210 can be further included. The main board 185 further includes a bump groove 222 recessed in the boss groove 221 in response to a shape of the boss bump 215. The boss bump 215 and the bump groove 222 increase a connection force between the main board 185 and the case and can prevent the case of the mobile terminal 100 from being damaged by an impact. A boss accommodation part 210 is configured by putting the boss groove 221 and the bump groove together.

Figure 6:
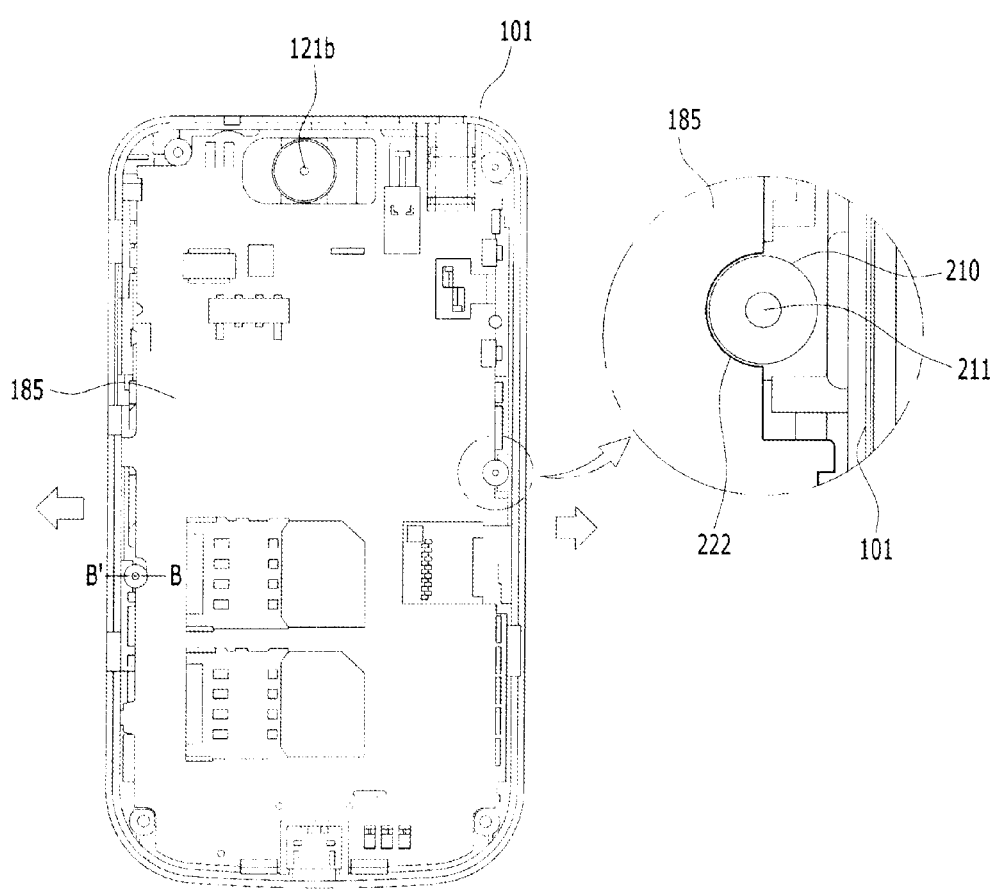
FIG. 6 is a rear side diagram for an example of a front case and a main board to compare with the present invention.
Figure 7:
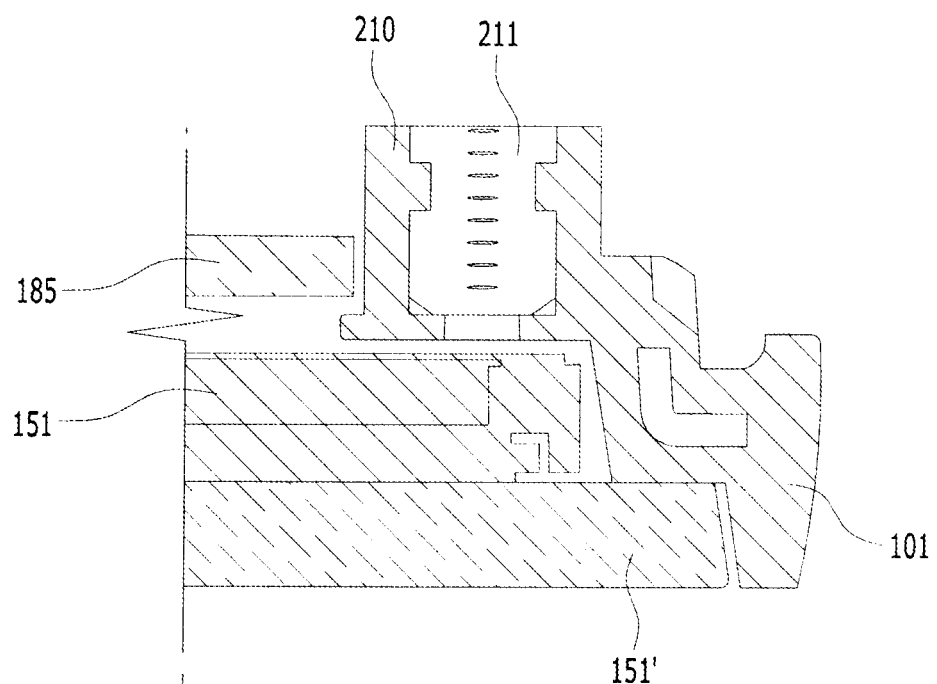
FIG. 7 is a B-B' cross sectional diagram of FIG. 6.

FIG. 6 is a rear side diagram for an example of a front case 101 and a main board 285 to compare with the present invention and FIG. 7 is a cross sectional diagram of FIG. 6. A boss 210 shown in FIGS. 6 and 7 does not include a boss bump 215.

If there is no boss bump 215 projected from a boss 210, since there is no structure used for connecting a circumstance of the main board 185 and a circumstance of the front case 101 with each other, a side of the case can be separated from each other in an arrow direction. Although the display unit 151 of the front side is combined with the front case 101 using adhesive or an adhesive tape, since the display unit 151 does not have hardness, a middle part of the case may be estranged from each other in the left and the right direction due to an external impact.

In particular, it is required to have a structure to connect the main board 185 and a sidewall of the case with each other.

Figure 8:
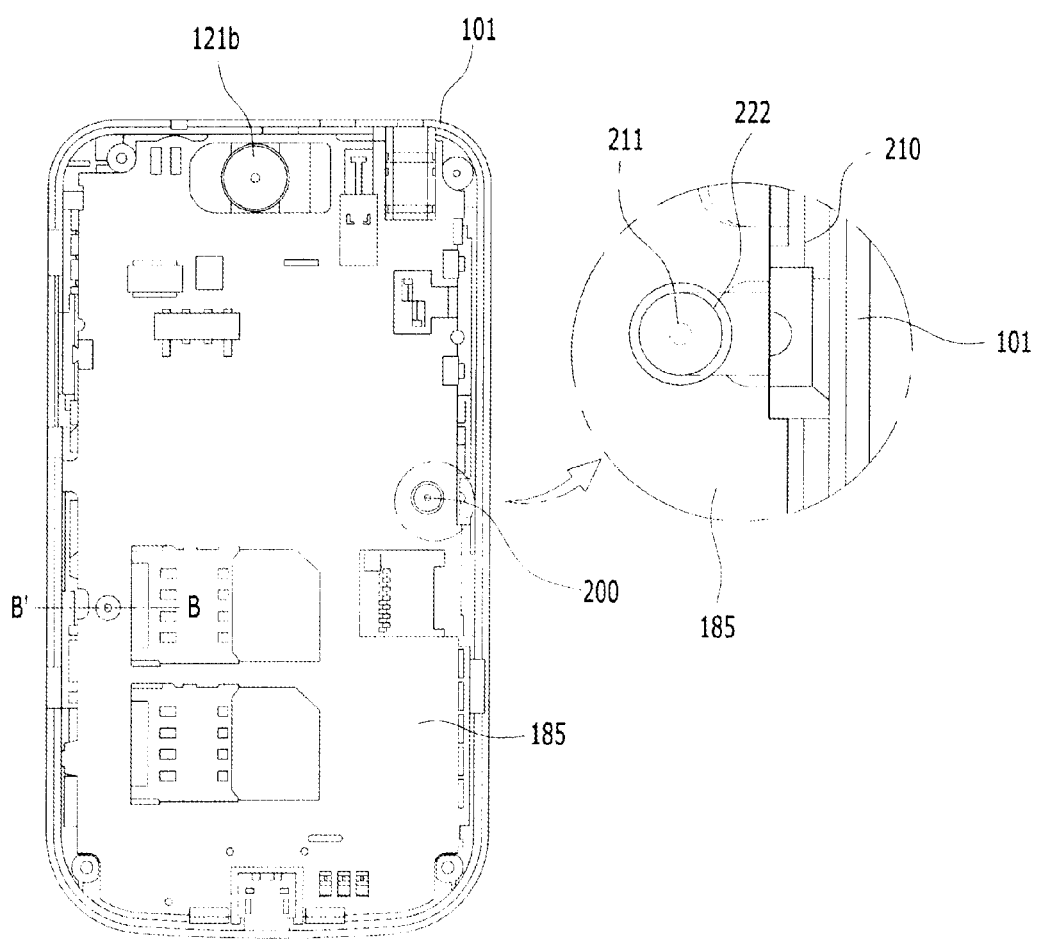
FIG. 8 is a rear side diagram for a different example of a front case and a main board to compare with the present invention.
Figure 9:
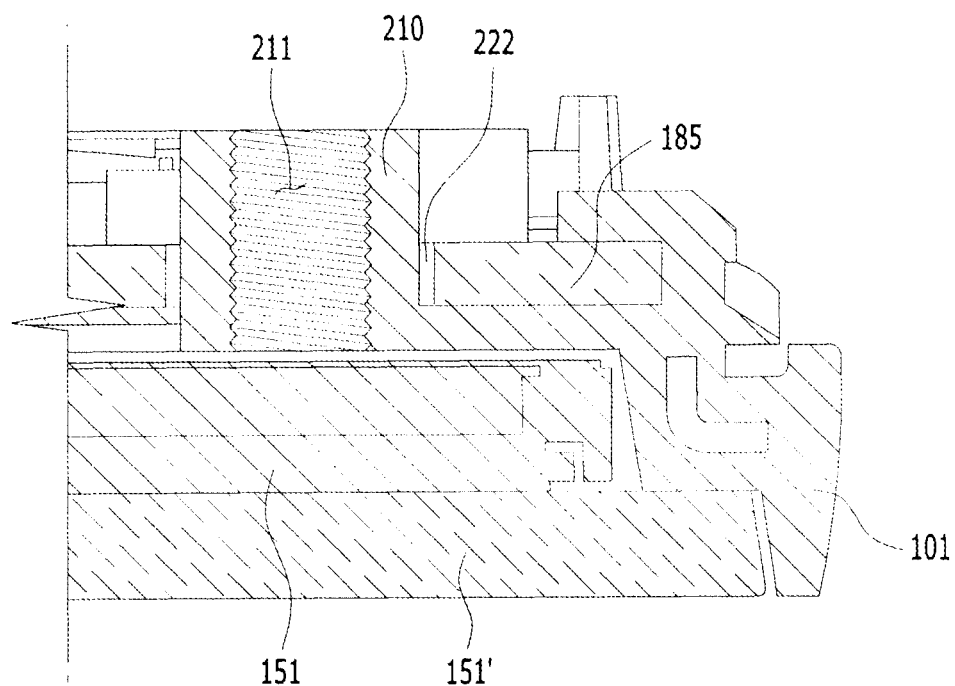
FIG. 9 is a C-C' cross sectional diagram of FIG. 8.

FIG. 8 is a rear side diagram for a different example of a front case 101 and a main board 185 to compare with the present invention and FIG. 9 is a cross sectional diagram of FIG. 8. As shown in the drawing, since a boss 210 is connected with a main board 185 in a manner of passing through a hole formed on the main board 185, it is able to prevent a phenomenon that a sidewall is detached to the outside direction as shown in the embodiment of FIG. 6.

Yet, as shown in FIG. 9, when the boss 210 of a type passing through the main board 185 is formed, since the boss 210 is more projected to the inside compared to the embodiment of FIG. 6 (refer to FIG. 8) and not a hole recessed on an end part of the main board 185 but a hole penetrating the main board 185 is formed, a size of a space dedicated for connecting with the boss 210 becomes large on the main board 185.

Since many electronic parts are mounted on the main board 185 and circuits are passing through the main board, it is necessary to increase space utilization. Yet, as shown in FIG. 8, if the boss 210 is connected with the main board 185 in a manner of being projected to the inside, a space of the main board 185 required for mounting electronic parts is reduced.

And, as the boss 210 is getting far from a sidewall, a connection force between a front case 101 and a rear case 102 becomes weak and there may exist a gap between the front case 101 and the rear case 102.

In order to solve the problems mentioned earlier in FIG. 6 and FIG. 8, i.e., a phenomenon that a sidewall is detached to the outside direction and a phenomenon that there exists a gap between the front case 101 and the rear case 102, and provide a connection structure capable of minimally using a space of the main board 185 on which electronic parts are mounted, as mentioned in the foregoing description, the present invention includes a boss bump 215 in an outer side circumstance of the boss 210.

As shown in FIG. 4, the boss bump 215 of the boss 210 can be projected in a diagonal direction on the basis of a horizontal direction of the mobile terminal 100. Since the boss bump is aimed for preventing the case from making a gap in horizontal direction, the boss bump is diagonally formed. And, if two or more boss bumps 215 are formed, a connection force between the main board 185 and the front case 101 can be increased.

A cross section of the boss bump 215 and a cross section of the boss 210 can be formed in a shape of a semicircle. In a process of cutting the main board 185 using laser, if an outer circumstance is bending while making a gentle curve, an error due to a tolerance can be minimized. Yet, it may not be limited to a boss bump 215 of a curved line only. Instead, it may be equipped with a boss bump 215 including a cross section of a polygon such as a rectangle.

Since the boss 210 is connected with the rear case 102, the boss 210 is projected by a height capable of being in contact with an inner side of the rear case 102. On the contrary, since the boss bump 215 is connected with the main board 185, the boss bump can be projected by a height corresponding to thickness of the main board 185.

If a connection structure including a hook and a connection groove is equipped between a plurality of bosses 210, an error making a gap between cases can be more reduced. The hook and the connection groove can be formed in response to the rear case 102 and the front case 101, respectively.

Figure 10:
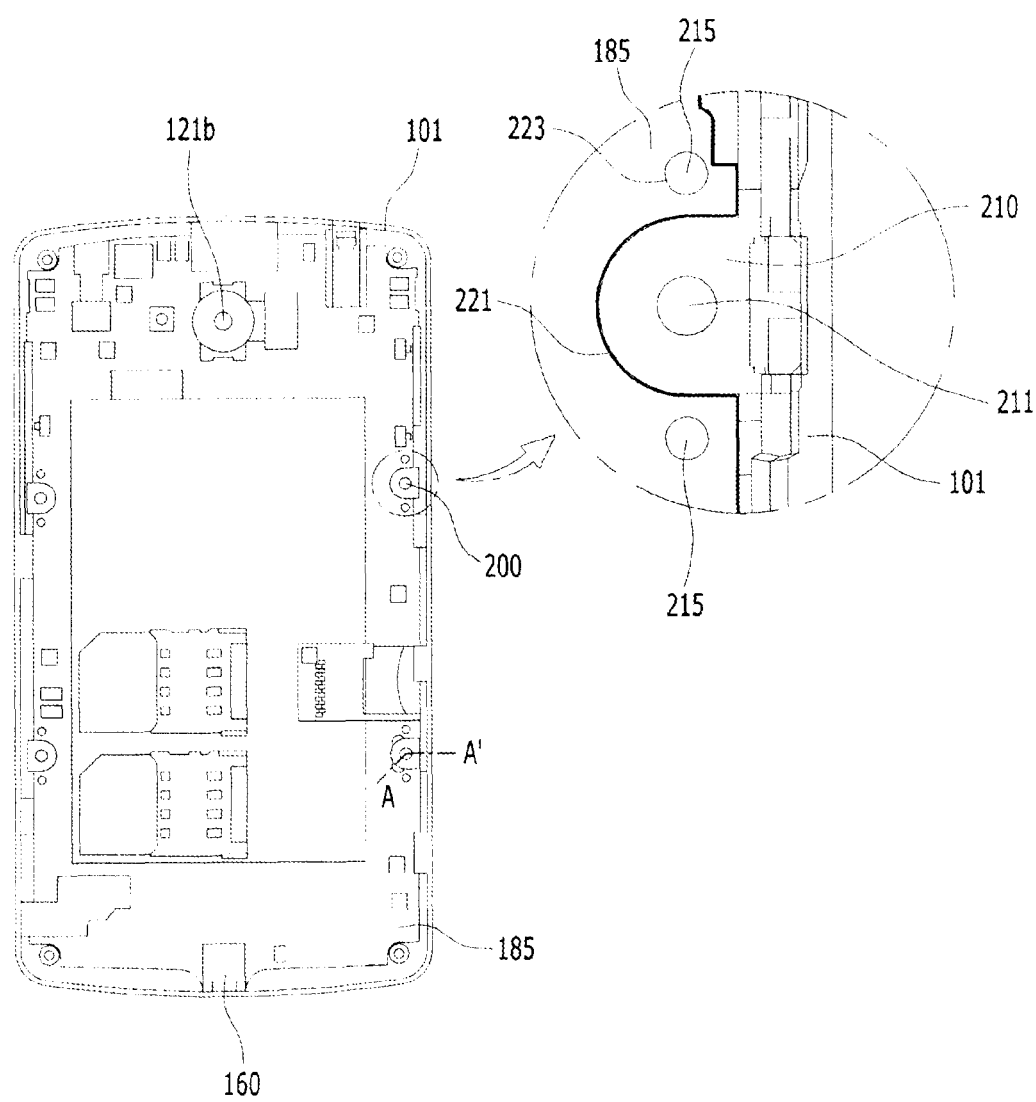
FIG. 10 is a rear side diagram for a different example of a mobile terminal according to the present invention.

FIG. 10 is a rear side diagram for a different example of a mobile terminal 100 according to the present invention. According to the present embodiment, a boss bump 215 is formed in a manner such that it is separate from a boss 210 instead of being combined with an outer circumstance of the boss 210. Further, the boss bump 215 can be formed in a manner such that is separate from the boss 210 and a sidewall of a front case. For example, the boss bump 215 may project rearward from a rear surface of the front case and pass through a hole or opening formed in the main board.

A bump hole 223 into which the boss bump 215 is inserted is formed on the main board 185. If the boss bump 215 is inserted into the bump hole 223, a connection force between the main board 185 and the front case 101 can be increased. By doing so, power inclined to a side direction can be prevented.

Since the boss bump 215 according to the present embodiment is smaller than the boss 210 in size, a space occupied by the boss bump on the main board 185 is smaller than that of the embodiment mentioned earlier in FIG. 8 and can solve a problem of making a gap between the front case 101 and the rear case 102.

As mentioned in the foregoing description, according to at least one or more embodiments of the present invention, it is able to reduce thickness of a mobile terminal by omitting a frame. And, it is able to prevent a case from making a gap in a horizontal direction via a stable connection structure. Moreover, it is also able to prevent a front case and a rear case from being separated from each other via the stable connection structure.

The foregoing embodiments are merely exemplary and are not to be considered as limiting the present disclosure. The present teachings can be readily applied to other types of methods and apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A mobile terminal comprising:
   a display unit;
   a front case having an opening formed there through, wherein the front case is configured to permit the display unit to be viewed through the opening from a front side of the front case;
   a main board configured to be combined with a rear side of the front case;
   a rear case configured to be combined with a rear side of the main board;
   a boss projecting inward from an edge portion of the front case, the boss having a rear-facing opening formed therein with an internal screw thread on an inner surface of the rear-facing opening, and the rear case including a connection hole formed to align with the rear-facing opening in the boss;
   a screw configured to pass through the connection hole and engage the internal screw thread; and
   a boss bump projecting laterally from a side surface of the boss,
   wherein the main board includes a boss accommodation part comprising:
   a boss groove accommodating the boss; and
   a bump groove having a recessed shape in the boss groove and accommodating the boss bump, and
   wherein the positioning of the boss groove together with the boss bump fixes the edge portion of the front case to the main board in an outward direction.

2. The mobile terminal of claim 1, wherein the boss bump projects diagonally from the side surface of the boss relative to a horizontal line perpendicular to the edge portion of the front case.

3. The mobile terminal of claim 1, wherein the boss comprises a plurality of boss bumps projecting from the side surface of the boss.

4. The mobile terminal of claim 1, wherein the boss bump has a rear surface and the boss has a rear surface, and wherein the rear surface of the boss is further rearward than the rear surface of the boss bump.

5. The mobile terminal of claim 1, wherein the boss is configured such that a rear surface of the boss projects further in a rearward direction than a rear surface of the main board and a rear surface of the boss bump.

6. The mobile terminal of claim 1, wherein the boss bump has a curved or polygonal shape.

7. The mobile terminal of claim 1, wherein the front case comprises a plurality of bosses projecting inward from an edge portion thereof, and at least one connection hook projecting inward from the edge portion of the front case and contacting the rear surface of the main board; and wherein the rear case comprises at least one connection groove, each connection groove aligning with and configured to receive a corresponding connection hook.

8. The mobile terminal of claim 1, wherein the main board is configured to contact a rear side of the display unit via the opening formed at the center of the front case.

* * * * *